US005525908A

United States Patent [19]
Brownell

[11] Patent Number: 5,525,908
[45] Date of Patent: Jun. 11, 1996

[54] ELECTRICAL OUTLET WIRING ANALYZER WITH FULL CYCLE PULSING

[75] Inventor: Greg A. Brownell, South Bend, Ind.

[73] Assignee: SEG Corporation, Mishawaka, Ind.

[21] Appl. No.: 146,578

[22] Filed: Nov. 1, 1993

[51] Int. Cl.$^6$ ................................................. G01R 31/02
[52] U.S. Cl. ........................................... 324/508; 324/509
[58] Field of Search .................................. 324/508, 509, 324/510, 520, 539, 555, 691, 710; 340/649, 650; 361/42

[56] References Cited

U.S. PATENT DOCUMENTS

| | | | |
|---|---|---|---|
| 3,376,502 | 4/1968 | Rink | 324/508 |
| 3,810,003 | 5/1974 | Portoulas | 324/508 |
| 3,996,496 | 12/1976 | Volk, Jr. | 340/649 |
| 4,206,398 | 6/1980 | Janning | 324/527 |
| 4,857,826 | 8/1989 | Graham | 324/509 |
| 5,365,179 | 11/1994 | Rogers | 324/509 |

OTHER PUBLICATIONS

Ecos Electronics Corporation, "Model 1020 Ground Impedance Tester"; 4 page Brochure; Date Unavailable.
"Sure Test Multi–Function Circuit Tester and E–Z Check Receptacle Circuit Testers"; Time Motion Tools 1989 catalog, p. 86. (Month Unavailable).
"SureTest Multi–Function Circuit Analyzers and BSK–B Accu–Test Ground Kit"; Specialized Products Co., Fall 1991 Catalog, p. 100 (Month Unavailable).

Primary Examiner—Kenneth A. Wieder
Assistant Examiner—Christopher M. Tobin
Attorney, Agent, or Firm—Barnes & Thornburg

[57] ABSTRACT

An electrical outlet wiring analyzer includes generator circuitry for periodically providing an alternating current pulse of one cycle at a frequency of an alternating current voltage supplied by an electrical outlet having a plurality of conductors. The wiring analyzer also includes connecting circuitry for electrically applying the alternating current pulse to at least one of the conductors and circuitry for determining an impedance of each of the conductors to which the alternating current pulse is applied. Another embodiment of the electrical outlet wiring analyzer includes pulser means for periodically providing a current pulse of one-half cycle at a frequency of an alternating current voltage supplied by an electrical outlet having a plurality of conductors. This embodiment of the electrical outlet wiring analyzer includes connecting circuitry for electrically applying the current pulse to at least one of the conductors and circuitry for determining an impedance of the conductors to which the current pulse is applied. Either of these embodiments of the electrical outlet wiring analyzer may further include circuitry for verifying electrical continuity and for determining polarity of the conductors of the electrical outlet and a voltage controlled switch that is electrically connected in series with the electrical continuity verifying and polarity determining circuitry. The voltage controlled switch prevents the electrical continuity verifying and polarity determining circuitry from operating with an electrical potential difference less than an electrical trigger potential difference of the voltage controlled switch circuitry.

27 Claims, 13 Drawing Sheets

ELECTRICAL OUTLET WIRING ANALYZER WITH FULL CYCLE PULSING

BACKGROUND AND SUMMARY OF THE INVENTION

The present invention relates to an electrical outlet wiring analyzer. More particularly, the present invention relates to an electrical circuit for testing the electrical continuity and configuration of conductors of an electrical outlet as well as determining the impedance of one or more of the conductors when a half-cycle or full-cycle alternating current pulse, with a frequency corresponding to the frequency of a line alternating current voltage of the electrical outlet, is applied thereto.

Electrical outlets must be properly grounded. In addition, the conductors used in electrical outlets must be properly configured according to the particular applications of an outlet. Improper grounding and/or conductor configuration can lead to such problems as injury to personnel utilizing an outlet, damage to equipment connected to an outlet, and fire. One factor that contributes to poor grounding of an electrical outlet is the presence of impedance on the designated ground conductor of the outlet. Impedance contains both a resistive component and a reactive component. The reactive component varies with the frequency of the applied voltage and current. Thus, in order to obtain an accurate measure of ground conductor impedance for an electrical outlet, signals at the frequency of the line alternating current voltage must be applied to the ground conductor. Signals at other frequencies will yield different and inaccurate ground conductor impedance values for an electrical outlet.

Different designs for electrical outlet wiring analyzers exist. One such design is known as a three-lamp outlet circuit tester. One problem with three-lamp outlet circuit testers is that they reveal nothing about the quality of the grounding conductor (i.e., the amount of impedance on the ground conductor). Problems with other designs include such things as improper measurement of conductor impedance (i.e., not measuring ground conductor impedance at the frequency of the line alternating current voltage) and general difficulty of use. An outlet wiring analyzer that solved the problems associated with the above-described designs would be a welcome improvement.

Accordingly, an electrical outlet wiring analyzer is provided. The wiring analyzer includes circuitry for verifying electrical continuity and for determining polarity of conductors of an electrical outlet. Voltage controlled switch circuitry is electrically connected in series with the electrical continuity verifying and polarity determining circuitry. The voltage controlled switch circuitry prevents the electrical continuity verifying and polarity determining circuitry from operating with an electrical potential difference less than an electrical trigger potential difference of the voltage controlled switch circuitry. The voltage controlled switch circuitry may include a sidac. Circuitry for determining the impedance of at least one of the conductors at the frequency of the alternating current voltage supplied by the electrical outlet or the potential difference between at least one conductor and a reference conductor is also provided.

In one embodiment, the electrical continuity verifying and polarity determining circuitry includes a light emitting diode electrically connected in parallel with circuitry for preventing the reverse bias of the light emitting diode and circuitry for diverting current from the light emitting diode to prevent false indications of electrical continuity and polarity of the conductors due to leakage current from items electrically connected to one or more of the conductors. The circuitry for diverting current may include a resistor and the circuitry for preventing reverse bias of the light emitting diode may include a diode having an anode electrically connected to a cathode of the light emitting diode and a cathode electrically connected to an anode of the light emitting diode.

The electrical outlet wiring analyzer may find application in an electrical outlet having three conductors: a hot conductor, a neutral conductor, and a ground conductor. In such application, the electrical outlet wiring analyzer would have electrical continuity verifying and polarity determining circuitry and voltage controlled switch circuitry electrically connected between each of the hot and the neutral conductors, the hot and the ground conductors, and the neutral and the ground conductors.

Another embodiment of the electrical outlet wiring analyzer includes impedance determining circuitry for determining an impedance of at least one electrical conductor of an electrical outlet, having a plurality of conductors, at the frequency of the alternating current voltage supplied by the electrical outlet. In this embodiment, the electrical outlet wiring analyzer also includes connecting circuitry for connecting at least one of the conductors of the electrical outlet to the impedance determining circuitry. The impedance determining circuitry may utilize an alternating current pulse of one cycle at a frequency of the alternating current voltage to determine the impedance of the conductor to which the current pulse is applied. Alternatively, the impedance determining circuitry may utilize a current pulse of one-half cycle at a frequency of the alternating current voltage to determine the impedance of the conductor to which the current pulse is applied. The electrical outlet wiring analyzer may further include circuitry for determining a potential difference between at least one conductor and a reference conductor. The potential difference determining circuitry may determine both the positive and negative potential difference between the conductors.

Another embodiment of the electrical outlet wiring analyzer includes generator circuitry for periodically providing an alternating current pulse of one cycle at a frequency of an alternating current voltage supplied by an electrical outlet that has a plurality of conductors. In this embodiment, the electrical outlet wiring analyzer also includes connecting circuitry for electrically applying the alternating current pulse to at least one of the conductors and impedance determining circuitry for determining the impedance of each of the conductors to which the alternating current pulse is applied. This embodiment of the electrical outlet wiring analyzer may find application in an electrical outlet having three conductors: a hot conductor, a neutral conductor, and a ground conductor. For such an electrical outlet, the connecting circuitry would selectively apply the alternating current pulse to the ground or neutral conductors. The electrical outlet wiring analyzer may also have a jack for electrically attaching to a remote ground conductor. In this embodiment, the connecting circuitry would selectively apply the alternating current pulse to either the neutral, ground, or remote ground conductors.

In one embodiment, the generator circuitry of the electrical outlet wiring analyzer includes a zero-voltage switch crossing circuit, a timer, a push button switch, and a current controlled switch. The zero-voltage switch crossing circuit is electrically connected to the timer and the push button switch is electrically connected between the zero-voltage switch crossing circuit and the timer. The current controlled switch is electrically connected to the alternating current voltage supplied by the electrical outlet, the connecting means, and an output of the zero-voltage switch crossing circuit. The output of the zero-voltage switch crossing circuit enables the current controlled switch for one cycle of the alternating current voltage. This embodiment of the generator circuitry may include circuitry for limiting the magnitude of the alternating current pulse electrically connected between the current controlled switch and the connecting means. The alternating current pulse magnitude limiting circuitry may include a resistor and the current controlled switch may include a triac. A gate of the triac may be electrically connected to an output of the zero-voltage switch crossing circuit, a main terminal 1 of the triac may be electrically connected to the resistor, and a main terminal 2 of the triac may be electrically connected to the alternating current voltage. Thermal overload circuitry may be included for preventing thermal overload of the alternating current pulse magnitude limiting circuitry.

The electrical outlet wiring analyzer may include circuitry for indicating the application of the alternating current pulse to the selected conductor. The alternating current pulse application indicating circuitry may be electrically connected in parallel with the alternating current pulse magnitude limiting circuitry. The alternating current pulse application indicating circuitry may include voltage controlled switch circuitry electrically connected in series with a light emitting diode that is electrically connected in parallel with both circuitry for preventing reverse bias of the light emitting diode and circuitry for diverting current from the light emitting diode to prevent false indications of the application of the alternating current pulse due to current from items electrically connected to the conductors. The voltage controlled switch circuitry prevents operation of the light emitting diode with an electrical potential difference less than an electrical trigger potential difference of the voltage controlled switch circuitry. In one embodiment, the voltage controlled switch circuitry includes a sidac and the light emitting diode reverse bias preventing circuitry includes a diode, and the current diverting circuitry includes a resistor. The diode has an anode electrically connected to a cathode of the light emitting diode and a cathode electrically connected to an anode of the light emitting diode.

The connecting circuitry may include a switch. The impedance determining circuitry may include circuitry for indicating an impedance value, voltage controlled switch circuitry for controlling the enabling of the impedance value indicating circuitry, circuitry for supplying a regulated voltage to both the impedance value indicating circuitry and the voltage controlled switch circuitry, and voltage divider circuitry for providing at least two different voltages to the voltage controlled switch circuitry. The voltage controlled switch circuitry is electrically connected to the impedance value indicating circuitry and the voltage divider circuitry. The voltage divider circuitry is electrically connected to the conductor to which the alternating current pulse is applied. The voltage controlled switch circuitry may include metal oxide silicon field-effect transistors each having a drain, a source, and a gate. The sources of the metal oxide silicon field-effect transistors may be electrically connected to the regulated voltage supplying circuitry. The gates of the metal oxide silicon field-effect transistors may be electrically connected to the voltage divider circuitry. The impedance value indicating circuitry may include light emitting diodes having anodes which are electrically connected to the regulated voltage supplying circuitry and cathodes which are electrically connected to the drains of the metal oxide silicon field-effect transistors.

In one embodiment of the impedance determining circuitry, the voltage divider circuitry includes two separate sets of resistors. A first set of resistors is connected to gates of N-channel metal oxide silicon field-effect transistors. The first set has circuitry for applying only a positive half-cycle of the alternating current pulse to the gates of the N-channel metal oxide silicon field-effect transistors. A second set of resistors is connected to the gates of P-channel metal oxide silicon field-effect transistors. The second set of resistors has circuitry for applying only a negative half-cycle of the alternating current pulse to the gates of the P-channel metal oxide silicon field-effect transistors. The circuitry for applying only the positive and negative half cycles of the alternating current pulse may include diodes.

In another embodiment of the impedance determining circuitry, the regulated voltage supplying circuitry includes first regulator circuitry that supplies regulated power to N-channel metal oxide silicon field-effect transistors during a positive half-cycle of the alternating current voltage supplied by the electrical outlet and second regulator circuitry for supplying regulated power to P-channel metal oxide silicon field-effect transistors during a negative half-cycle of the alternating current voltage supplied by the electrical outlet. The circuitry for the first and second regulators may include a resistor, a diode, and a zener diode.

The impedance value indicating circuitry may indicate the impedance value during both a positive and negative half-cycle of the alternating current pulse. In addition, the impedance value indicating circuitry may indicate the electrical potential difference between the conductor to which the alternating current pulse is applied and a reference conductor prior to and subsequent to the application of the pulse. Both the conductor to which the alternating current is applied and the reference conductor are selected by the connecting means. In one embodiment, both the positive and negative electrical potential differences between the conductors is indicated.

The electrical outlet wiring analyzer having at least the generator circuitry, connecting circuitry, and impedance determining circuitry may further include the above-described circuitry for verifying electrical continuity and for determining polarity of the conductors of the electrical outlet.

Another embodiment of the electrical outlet wiring analyzer includes pulser circuitry for periodically providing an current pulse of one-half cycle at a frequency of the alternating current voltage supplied by an electrical outlet that has a plurality of conductors. In this embodiment, connecting circuitry for electrically applying the current pulse to at least one of the conductors is provided. Circuitry for determining an impedance of the conductors to which the current pulse is applied is also provided.

The electrical outlet wiring analyzer of this embodiment may find application with an electrical outlet having three conductors: a hot conductor, a neutral conductor, and a ground conductor. In such an embodiment, the connecting means selectively applies the current pulse to either the neutral or ground conductors.

In one embodiment, the pulser circuitry includes a timer, a zero-voltage crossing opto-coupler, and a current controlled switch. The current controlled switch is electrically connected to an output of the zero-voltage crossing opto-coupler, the alternating current voltage supplied by the electrical outlet, and the connecting means. An output of the zero-voltage crossing opto-coupler enables the current controlled switch for one cycle of the alternating current voltage so that the current controlled switch outputs a half-wave current pulse. The electrical outlet wiring analyzer may also include circuitry for limiting the magnitude of the current pulse. This circuitry is electrically connected between the current controlled switch and the alternating current voltage. In one embodiment, the current pulse magnitude limiting circuitry includes a resistor and the current controlled switch includes a silicon controlled rectifier. A gate of the silicon controlled rectifier is electrically connected to the output of the zero-voltage crossing opto-coupler. An anode of the silicon controlled rectifier is electrically connected to the resistor and a cathode of the silicon controlled rectifier is electrically connected to the connecting means.

Circuitry for indicating the application of the alternating current pulse may also be provided. The current pulse application indicating circuitry is electrically connected in parallel with the current pulse magnitude limiting circuitry. The current pulse application indicating circuitry may include voltage controlled switch circuitry that is electrically connected in series with a light emitting diode electrically connected in parallel with both circuitry for preventing reverse bias of the light emitting diode and circuitry for diverting current from the light emitting diode to prevent false indications of the application of the current pulse due to current from items electrically connected to the conductors. The voltage controlled switch circuitry prevents the operation of the light emitting diode with an electrical potential difference less than an electrical trigger potential difference of the voltage controlled switch circuitry. The voltage controlled switch circuitry may include a sidac. The light emitting diode reverse bias preventing circuitry may include a diode, and the current diverting circuitry may include a resistor. The diode has an anode electrically connected to a cathode of the light emitting diode and a cathode electrically connected to an anode of the light emitting diode.

The connecting means of the electrical outlet wiring analyzer may include a switch. The impedance determining means may include circuitry for indicating an impedance value, voltage controlled switch circuitry for controlling the enabling of the impedance value indicating circuitry, circuitry for supplying a regulated voltage to both the impedance value indicating circuitry and the voltage controlled switch circuitry, and voltage divider circuitry for providing at least two different voltages to the voltage controlled switch circuitry. In this embodiment, the voltage controlled switch circuitry is electrically connected to the impedance value indicating circuitry and the voltage divider circuitry. The voltage divider circuitry is electrically connected to the conductor to which the current pulse is electrically applied. The voltage controlled switch circuitry may include metal oxide silicon field-effect transistors each having a drain, a source, and a gate. The sources of the metal oxide silicon field-effect transistors may be electrically connected to the regulated voltage supplying circuitry. The gates of the metal oxide silicon field-effect transistors may be electrically connected to the voltage divider circuitry. The impedance value indicating circuitry includes light emitting diodes. The anodes of the light emitting diodes are electrically connected to the regulated voltage supplying circuitry and the cathodes of the light emitting diodes are electrically connected to the drains of the metal oxide silicon field-effect transistors.

The electrical outlet wiring analyzer that produces only a half-cycle current pulse may also include the above-described circuitry for verifying electrical continuity and for determining polarity of the conductors of the electrical outlet.

Other objects, advantages and novel features of the present invention will become apparent from the following detailed description of the invention when considered in conjunction with the accompanying drawings.

DETAILED DESCRIPTION OF THE DRAWINGS

Figure 1:
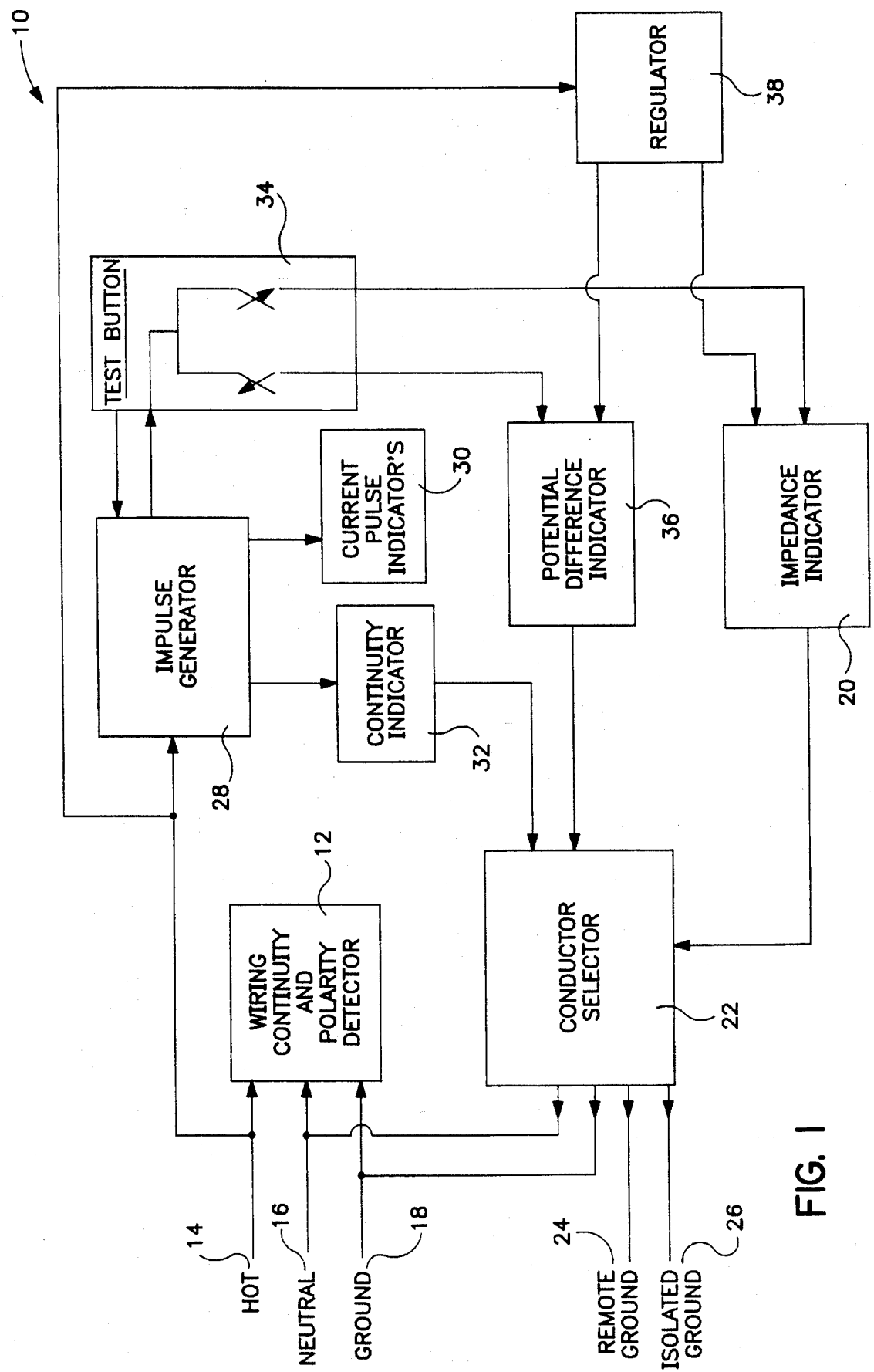
FIG. 1 shows a block diagram of an embodiment of an electrical outlet wiring analyzer 10 of the present invention.

FIG. 1 shows a block diagram of an embodiment of an electrical outlet wiring analyzer 10 of the present invention. Wiring analyzer 10 includes a wiring continuity and polarity detector 12 for verifying the electrical continuity and determining the polarity of the hot 14, neutral 16, and ground 18 conductors of and an electrical outlet (not shown). Wiring analyzer 10 also includes an impedance indicator 20 that indicates the impedance of a particular conductor selected by conductor selector 22 at the frequency of a line voltage supplied by the electrical outlet. As can be seen in FIG. 1, conductor selector 22 connects impedance indicator 20 to the neutral 16, ground 18, remote ground 24, or isolated ground 26 conductors. Impedance indicator 20 measures the impedance of a conductor at the frequency of a line alternating current (ac) voltage appearing on hot conductor 14. This is done because impedance contains both a resistive component and a reactive component. The reactive component varies with the frequency of the applied voltage and current. Thus, in order to obtain an accurate measure of conductor impedance, signals at the frequency of the line voltage must be applied to the conductor. Signals at other frequencies will yield different and inaccurate conductor impedance values for an electrical outlet.

Impulse generator 28 provides an ac current pulse at the frequency of the line voltage appearing on hot conductor 14. The current pulse is intended to contain no harmonics of the fundamental frequency of the line voltage. A current pulse indicator 30 indicates when an alternating current pulse is provided. A continuity indicator 32 is electrically connected to impulse generator 28 such that it permits verification of the continuity of remote ground 24 conductors when selected by conductor selector 22.

Test button 34 is activated by a user of analyzer 10 when a user desires to ascertain the impedance of a particular conductor at the frequency of the line voltage, appearing on hot conductor 14, selected by conductor selector 22. Test button 34 illustrates that impedance indicator 20 is only enabled when button 34 is depressed by a user. When impedance indicator 20 is not enabled, potential difference indicator 36 is enabled. Potential difference indicator 36 measures the electrical potential difference between two conductors selected by conductor selector 22.

Finally, FIG. 1 shows a regulator 38 that supplies a regulated voltage to impedance indicator 20 and potential difference indicator 36. Regulator 38 receives power from the ac line voltage appearing on hot conductor 14.

Figure 2:
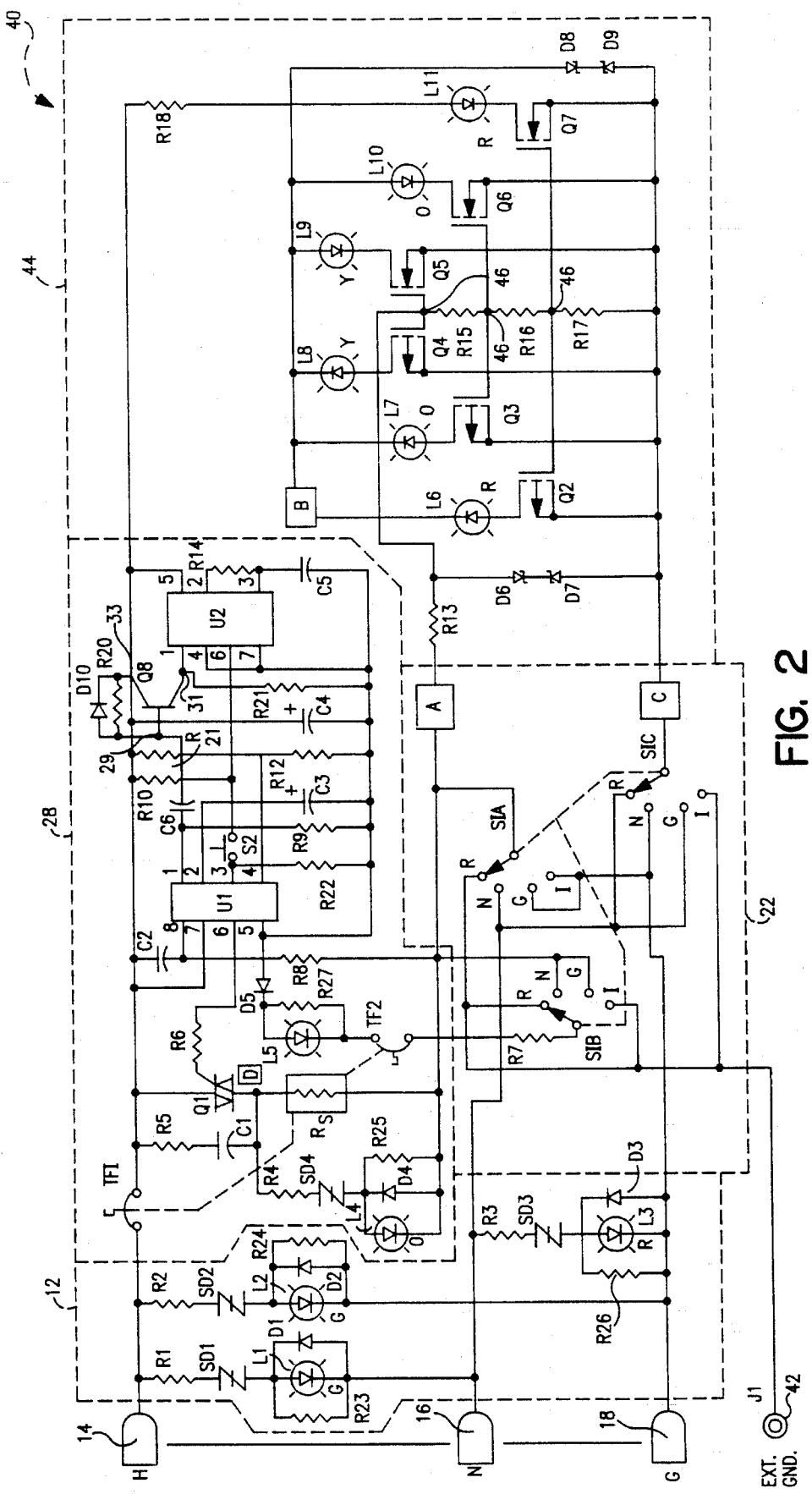
FIG. 2 shows a preferred embodiment of an electrical circuit for the electrical outlet wiring analyzer of FIG. 1.

FIG. 2 shows a preferred embodiment of an electrical circuit 40 for the electrical outlet wiring analyzer 10 of FIG. 1. Wiring continuity and polarity detector 12 is shown as are hot 14, neutral 16, and ground 18 conductors. In addition, an external ground conductor 42 is provided for connection to remote ground 24 (see FIG. 1). As discussed in connection with FIG. 1, wiring continuity and polarity detector 12 provides a means for verifying the electrical continuity of conductors 14, 16, and 18 as well as their polarity. As shown in FIG. 2, wiring continuity and polarity detector 12 includes three light emitting diode (LED) indicators L1–L3 electrically connected such that L1 is connected between hot 14 and neutral 16 conductors, L2 is between hot 14 and ground 18 conductors, and L3 is between neutral 16 and ground 18 conductors. Electrically associated with LEDs L1–L3 are current limiting resistors R1–R3, current diverting resistors R23, R24, and R26, rectifier diodes D1–D3 and sidacs SD1–SD3. Resistors R23, R24, and R26 are designed to divert current around LEDs L1–L3 in order to reduce the tendency for false indications of continuity due to leakage current flowing to ground from other electrical items on the conductors. Rectifier diodes D1–D3 prevent reverse bias of LEDs L1–L3 and sidacs SD1–SD3 function as voltage-dependant switches to prevent LEDs L1–L3 from operating with line voltages from hot conductor 14 of less than a predetermined amount.

In the configuration shown in FIG. 2, LEDs L1–L3 would indicate any of the following conditions:

1. If L1–L3 not lit, then open hot conductor 14 or open neutral 16 and ground 18 conductors;
2. If L1 lit and L2 and L3 not lit, then open ground conductor 18;
3. If L2 lit and L1 and L3 not lit, then open neutral conductor 16;
4. If L1 and L2 lit and L3 not lit, then correct wiring;
5. If L3 lit and L1 and L2 not lit, then hot conductor 14 on ground conductor 18 or hot conductor 14 on neutral conductor 16 with hot conductor 14 open;
6. If L1 and L3 lit and L2 not lit, then hot 14 and neutral 16 conductors reversed;
7. If L2 and L3 lit and L1 not lit, then hot 14 and ground 18 conductors reversed; and
8. If L1–L3 lit, then two hot conductors 14.

A preferred embodiment of impulse generator 28 is shown in FIG. 2 and generates an ac current pulse in full-wave, one-cycle bursts to a conductor selected by conductor selector 22. The full cycle pulse occurs at the frequency of the line voltage appearing at hot conductor 14. The pulses are produced by the combination of integrated circuits U1 and U2, push button S2, triac Q1, load resistor Rs and the electrical components associated with controlling these devices. U1 and U2 derive a direct current (dc) operating supply voltage from resistor R7, light emitting diode LS, diode D5, and capacitor C4. U1 is a zero-voltage crossing switch circuit and contains a zener diode between pins 5 and 7 thereof to clamp this dc operating supply voltage.

U1 includes a ramp (sawtooth) generator at pin 1 that utilizes resistor R9 and capacitor C3, a zero-voltage synchronization circuit whose sync input is located at pin 8, and a zero-crossing synchronized triac driver output at pin 6. Pin 8 of U1 is coupled to hot conductor 14 through resistor R8 with capacitor C2 providing a minute degree of phase shift of the ac line voltage on hot conductor 14 because triac Q1 cannot fire at exactly zero volts.

Integrated circuit U2 is a precision timer connected as a one-shot. When a dc operating supply voltage is present at U1 and U2, U1 produces a positive ramp (sawtooth) output at pin 1 with a predetermined period. The falling edge of the ramp output causes a negative pulse at base 29 of pnp bipolar transistor Q8 through capacitor C6 which is inverted to a positive pulse at the collector 31 of Q8 which is connected to pin 1 of U2. Diode D10 provides a discharge path for C6 during the positive portion of the ramp so it is ready for the next ramp pulse. D10 also prevents a reverse bias condition between base 29 and emitter 33 of Q2 caused by discharge of C6.

U2 is triggered on the positive pulse signal appearing at its pin 1. When triggered, U2 produces an output signal pulse at pin 6 of limited duration. When push button S2 is closed, this output signal pulse is coupled to the enable input (pin 3) of U1. The zero-crossing logic of U1 delays this signal pulse in time until the zero-voltage crossing after the negative half cycle of the line voltage appearing on hot conductor 14 such that two output pulses appear at pin 6 of U1. The two output pulses appearing at pin 6 of U1 trigger triac Q1 during two consecutive half-cycles of the line voltage, the first positive, the second negative. This operation continues as long as push button S2 is depressed. In one embodiment of impulse generator 28, the sawtooth ramp signal at pin 1 of U1 has a period of about 3 seconds such that U2 is triggered approximately every 3 seconds. When triggered, U2 produces an output signal pulse of approximately 16 ms so as to correspond with a line voltage frequency of 60 Hz. The magnitude of this pulse is controlled by selecting an appropriate value of resistor Rs. Triggering of U2 is limited to approximately every 3 seconds in order to limit the power dissipated by load resistor Rs.

Load resistor Rs has two (2) thermal protection devices, TF1 and TF2, which are thermally coupled to Rs so as to be heated directly by the power dissipated in Rs. TF1 and TF2 provide a means for preventing thermal overload of load resistor Rs. TF1 is a thermal fuse that permanently opens at a predetermined temperature to prevent overheating of resistor Rs. TF2 is a snap-action bimetallic thermostat that limits the temperature of resistor Rs in normal operation by disabling the dc power supply to U1 and U2 at a specified temperature.

Conductor selector 22 is shown as including three switches S1A, S1B, and S1C. Switch S1A connects the ac current pulse produced by impulse generator 28 and point A to one of four selected conductors: remote ground 24 (designated by R), neutral 16 (designated by N), ground 18 (designated by G), or isolated ground 26 (designated by I). Switch S1B connects light emitting diode L5 to the neutral 16, ground 18, or external ground 42 conductors to form a continuity indicator. If there is continuity, then L5 will light. Switch SiC connects point C to one of the neutral 16, ground 18, or external ground 42 conductors.

Switches S1A-S1C of conductor selector 22 are set in four positions to perform the following functions:

1. Neutral (N)—applies the current pulse to neutral conductor 16 and uses ground conductor 18 as a voltage reference;
2. Ground (G)—applies the current pulse to ground conductor 18 and uses neutral conductor 16 as a voltage reference;
3. Remote (R)—applies the current pulse to external remote ground conductor 24 connected via external ground jack 42 and uses neutral conductor 16 as a voltage reference; and
4. Isolated (I)—applies the current pulse to isolated ground conductor 26 of an isolated ground receptacle and uses the external remote ground conductor 24 connected via external ground jack 42 as a voltage reference.

An embodiment of threshold detector 44 is shown in FIG. 2. Threshold detector 44 performs the functions of impedance indicator 20 and potential difference indicator 36 described with regard to FIG. 1. Threshold detector 44 has six light emitting diodes (LEDs) L6–L11 that can form a color-coded display readout. Threshold detector 44 utilizes connection points A, B, and C to connect with other circuitry of circuit 40. Connection point A connects the conductor under test selected by switch S1A of conductor selector 22. Connection point B supplies LEDs L6–L11 with a regulated power supply through resistor R18, clamped at a predetermined voltage by zener diodes D8 and D9. Connection point C forms a reference point to which connection point A is compared and is also the common return for the power supplied to LEDs L6–L11.

The voltage potential at point A relative to point C is applied to a resistive voltage divider string R13 and R15–R17 and clamped to a predetermined voltage by zener diodes D6 and D7. Points of the voltage divider are connected to gates 46 of complimentary pairs (one N-channel one P-channel) of metal oxide silicon field-effect transistors (MOSFETs) Q4–Q5, Q3–Q6, and Q2–Q7. The N-channel MOSFETs are turned on by a positive voltage at A with respect to C and the P-channel MOSFETs are turned on by a negative voltage at A with respect to C. The ratios of the voltage divider are chosen so that each complimentary pair of MOSFETs turns on at a predetermined voltage level so as to form a three step voltmeter.

When a current pulse is produced by impulse generator 28 and applied to a conductor selected by conductor selector 22, the potential difference across the selected conductor causes LEDs L6–L11 to flash according to the voltage level appearing at gates 46 of MOSFETs Q4–Q5, Q3–Q6, and Q2–Q7. The impedance of the selected conductor, assuming it is at zero potential when no current pulse is present, is equal to the magnitude of this potential difference divided by the known magnitude of the current pulse. As discussed above, the magnitude of the current pulse is controlled by selecting an appropriate value for load resistor Rs. LEDs L6–L11 all share a common current limiting resistor R18. During the positive half-cycle of the ac line voltage cycle, only Q5–Q7 and L9–L11 are forward biased and consume any power. During the negative half cycle, L6–L8 and Q2–Q4 are active. As more LEDs are on, the brightness is lower in each because of current sharing. However, this is not a drawback because only the highest level of impedance indicated by L6–L11 is of interest and lower ones are irrelevant. Furthermore, threshold detector 44 of FIG. 2 is designed such that the circuits of LEDs L6–L11 indicating higher levels of impedance draw more current and become the brightest lit.

Figure 3:
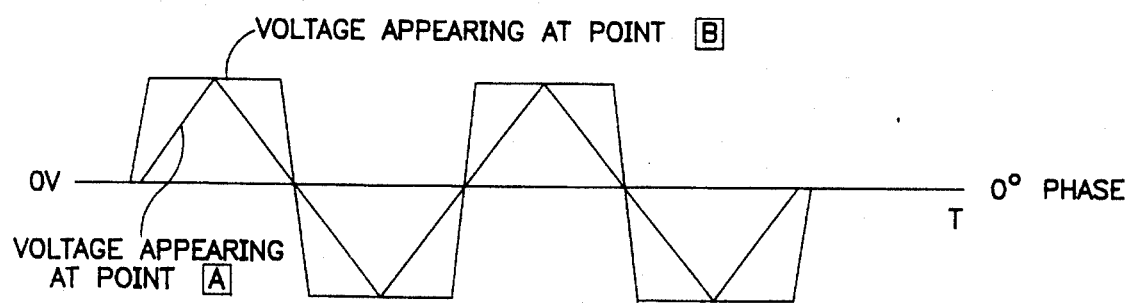
FIG. 3 shows a phase angle diagram for voltages appearing at points A and B of the circuit of FIG. 2.
Figure 4:
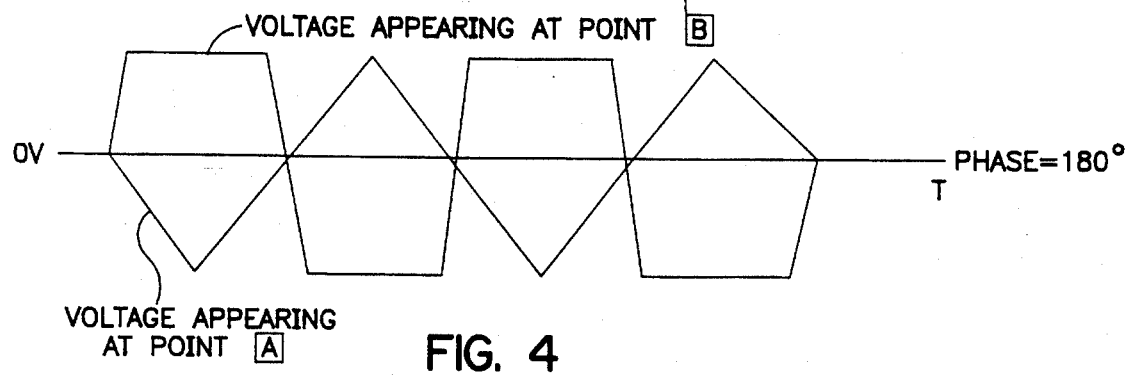
FIG. 4 shows a phase angle diagram for voltages appearing at points A and B of the circuit of FIG. 2 where the voltages are 180 degrees out of phase.
Figure 5:
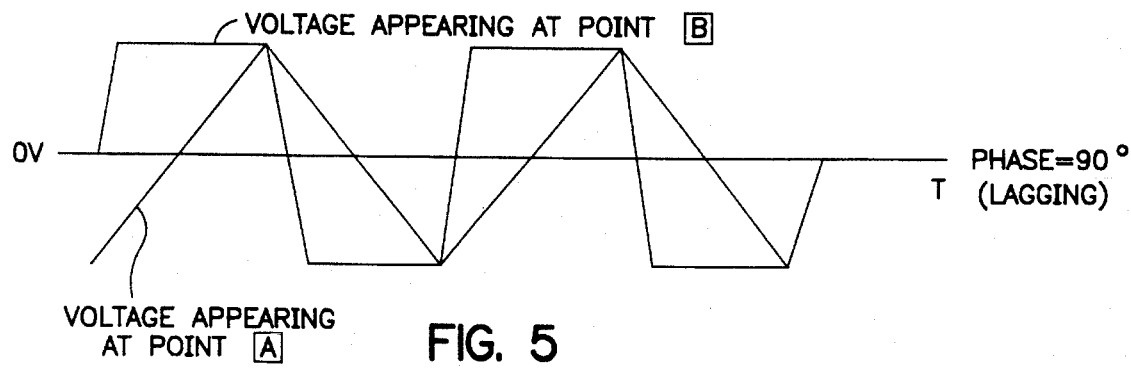
FIG. 5 shows a phase angle diagram for voltages appearing at points A and B of the circuit of FIG. 2 where the voltage at point A is lagging the voltage at point B by 90 degrees.
Figure 6:
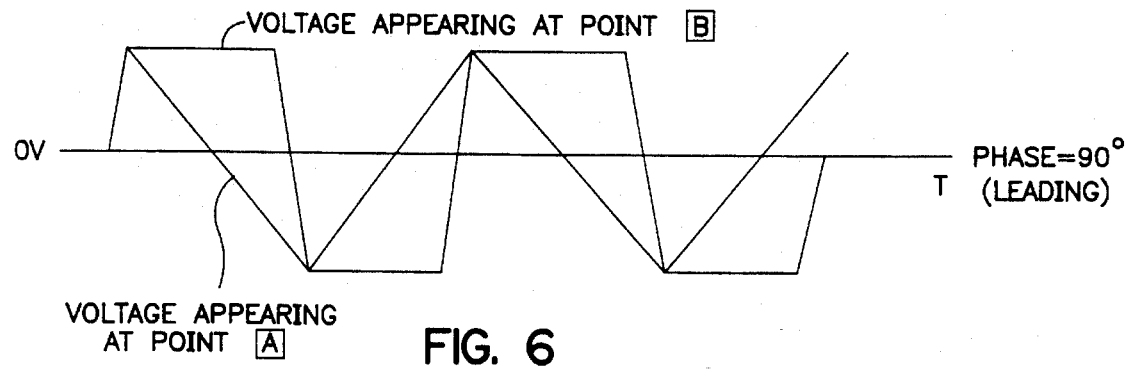
FIG. 6 shows a phase angle diagram for voltages appearing at points A and B of the circuit of FIG. 2 where the voltage at point A is leading the voltage at point B by 90 degrees.

The supply voltage at point B for LEDs L6–L11 is a square wave whose magnitude is clamped by zener diodes D8 and D9 and whose frequency is equal to the ac line voltage frequency appearing on hot conductor 14. The peak of the voltage appearing at point A and the gates 46 of MOSFETs Q4–Q5, Q3–Q6, and Q2–Q7 will always occur within the half cycle of the square wave voltage at point B and turn LEDs L6–L11 on, as shown in FIG. 3, unless the voltage at point A is 180 degrees out of phase with the square wave voltage at B, as shown in FIG. 4. Because the conductor impedance is a ratio of the applied voltage to the current developed through the conductor, the phase angle between the voltage and current on a conductor on which impedance is being measured can range from pure capacitive reactance to pure inductive reactance without affecting the reading of impedance displayed by LEDs L6–L11. FIG. 5 illustrates a case of pure capacitive reactance where the voltage appearing at point A lags behind the voltage appearing at point B by ninety (90) degrees. FIG. 6 illustrates a case of pure inductive reactance where the voltage appearing at point A leads the voltage appearing at point B by ninety (90) degrees. In the case where the voltage at point A is 180 degrees out of phase with the square wave voltage at point B, as shown in FIG. 4, it will appear as a voltage potential difference on the conductor opposite the selected conductor. This allows determination of which of two selected conductors has a potential difference with the same polarity as the ac line voltage appearing on hot conductor 14.

Figure 7:
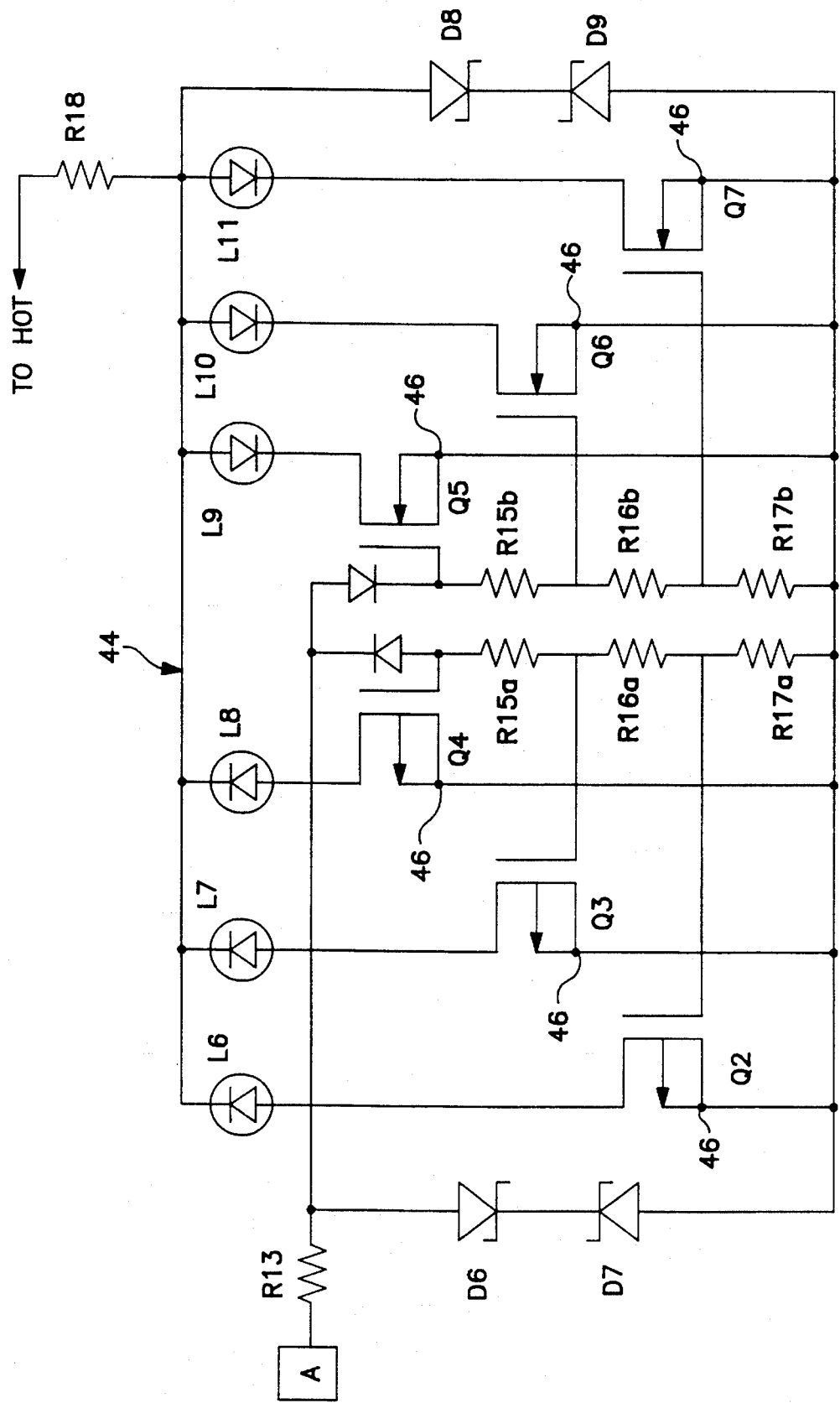
FIG. 7 shows an alternative embodiment for the threshold detector of the circuit of FIG. 2.

FIG. 7 shows an alternative embodiment for threshold detector 44. In this embodiment, the voltage divider of R13 and R15–R17 has been split into two electrically separate strings: resistor R13, diode D11 and resistors R15a–R17a and resistor R13, diode D12, and R15b–R17b. Diode D11 blocks the positive half-cycle of the ac current pulse and diode D12 blocks the negative half-cycle of the ac current pulse. In addition, MOSFETs Q2–Q7 do not have to be in complementary pairs as with threshold detector 44 of FIG. 2. Use of two different strings of voltage dividers and non-complementary pairs of MOSFETs allows for separate adjustment of the different positive and negative gate 46 thresholds of respective N-channel Q5–Q7 and P-channel Q2–Q4 MOSFETs.

Figure 8:
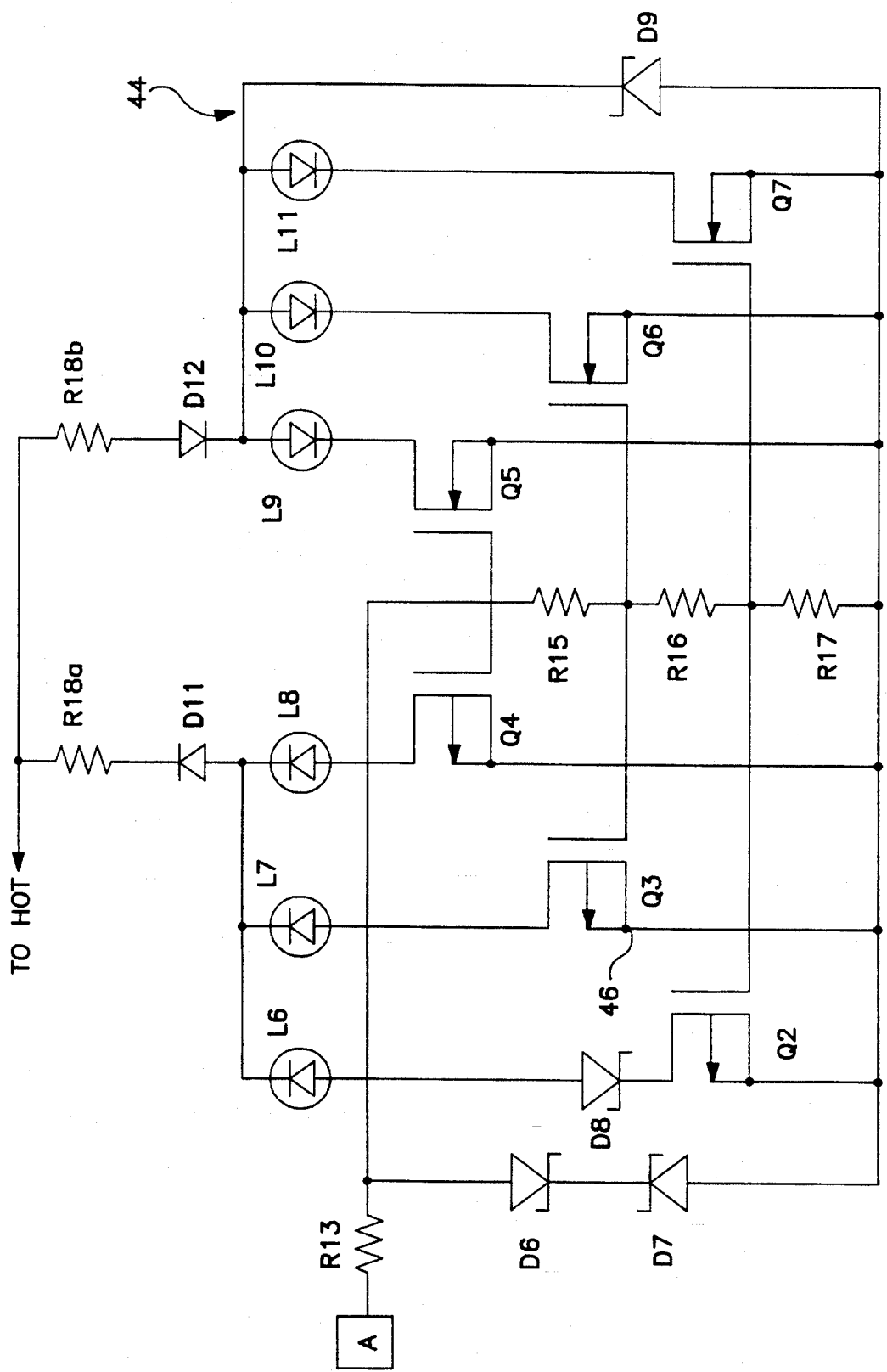
FIG. 8 shows another alternative embodiment for the threshold detector of the circuit of FIG. 2.

FIG. 8 shows another alternative embodiment for threshold detector 44. In this embodiment, resistor R18 has been split into two resistors to reduce the average power dissipated in resistor R18. In addition, diodes D11 and D12 have been added and zener diodes D8 and D9 have been separated so that the electrical series combination of P-channel MOSFETs Q2–Q4 and LEDs L6–L8 and the electrical series combination of N-channel MOSFETs Q5–Q7 and LEDs L9–L11 have separate regulated power supplies.

Figure 9:
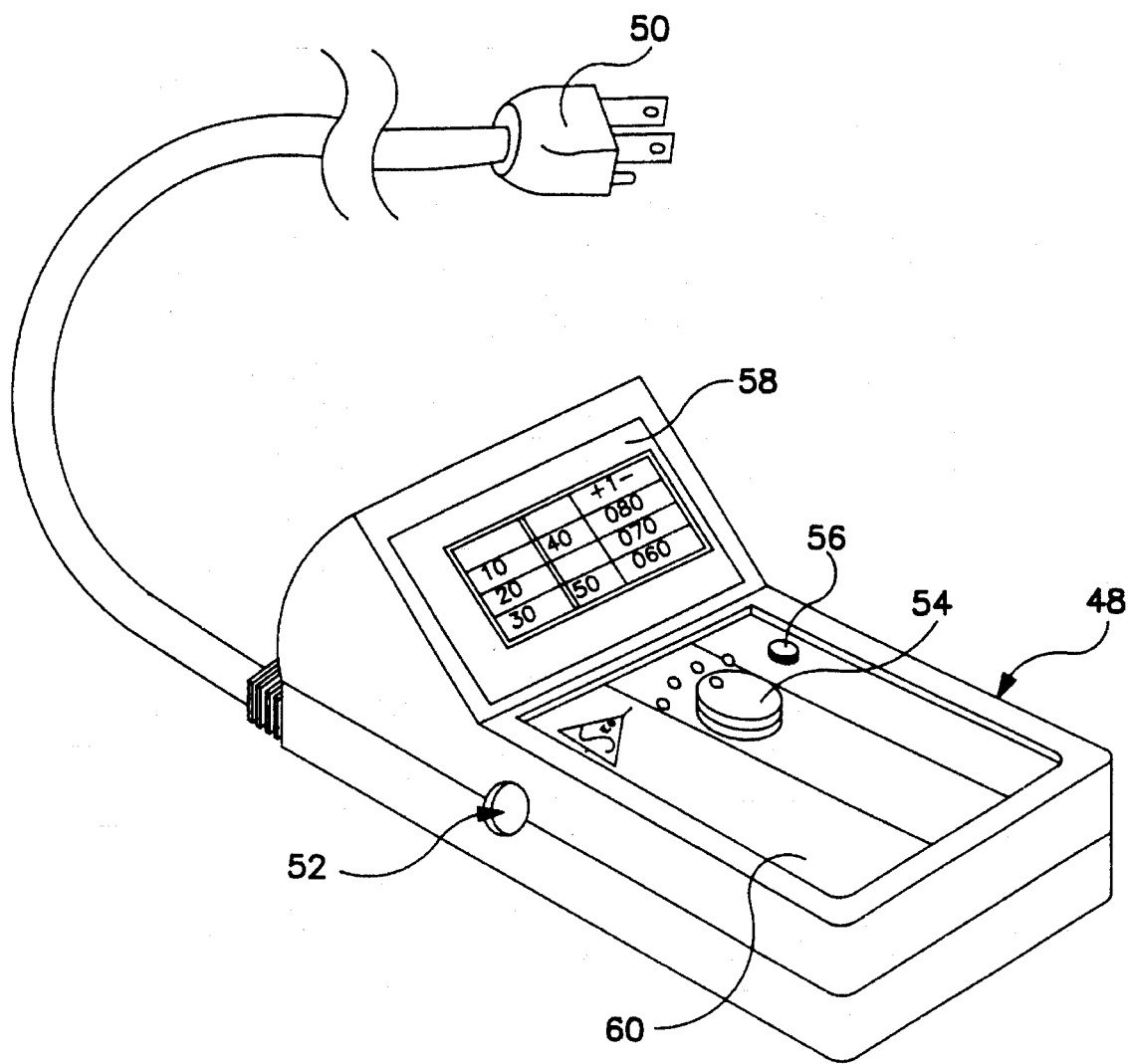
FIG. 9 shows an embodiment of a housing for the electrical outlet wiring analyzer of the present invention.

FIG. 9 shows an embodiment of a housing 48 that can be utilized with electrical outlet wiring analyzer 10. Housing 48 has an electrical plug 50 that is inserted into an electrical outlet (not shown) to be analyzed. A port 52 for attachment of a cable (not shown) to a conductor external from the electrical outlet, such as remote ground 24, is included. Housing 48 has a rotatable knob 54 for controlling conductor selector 22 and a depressible button 56 for creating one or more current pulses via impulse generator 28. For circuit 40, button 56 would control push button S2. Housing 48 includes a display panel 58, a front panel 60, and a rear panel (not shown) on which information can be displayed.

Figure 10:
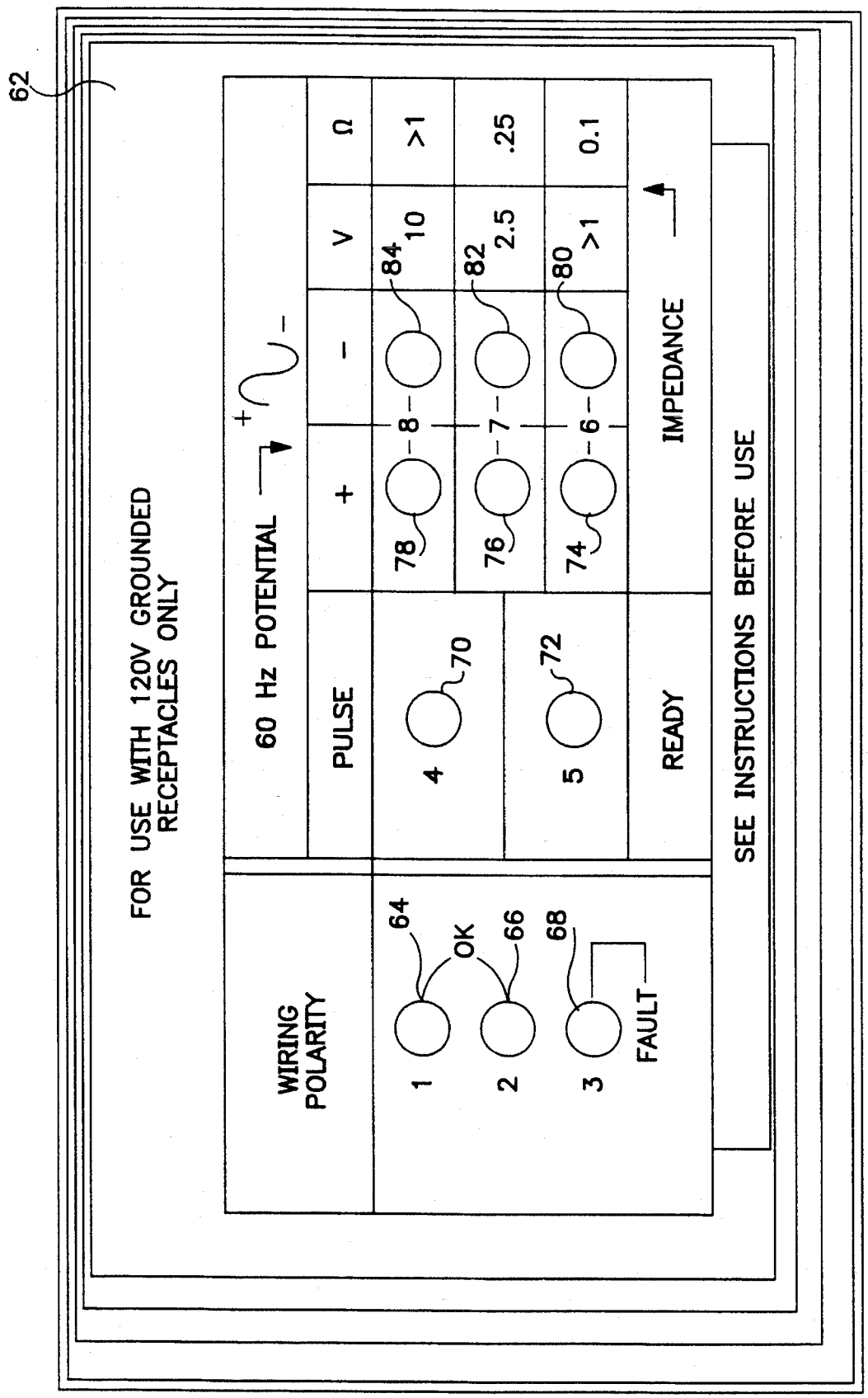
FIG. 10 shows an embodiment of an overlay for displaying information that can be utilized on a display panel of the housing shown in FIG. 9.
Figure 11:
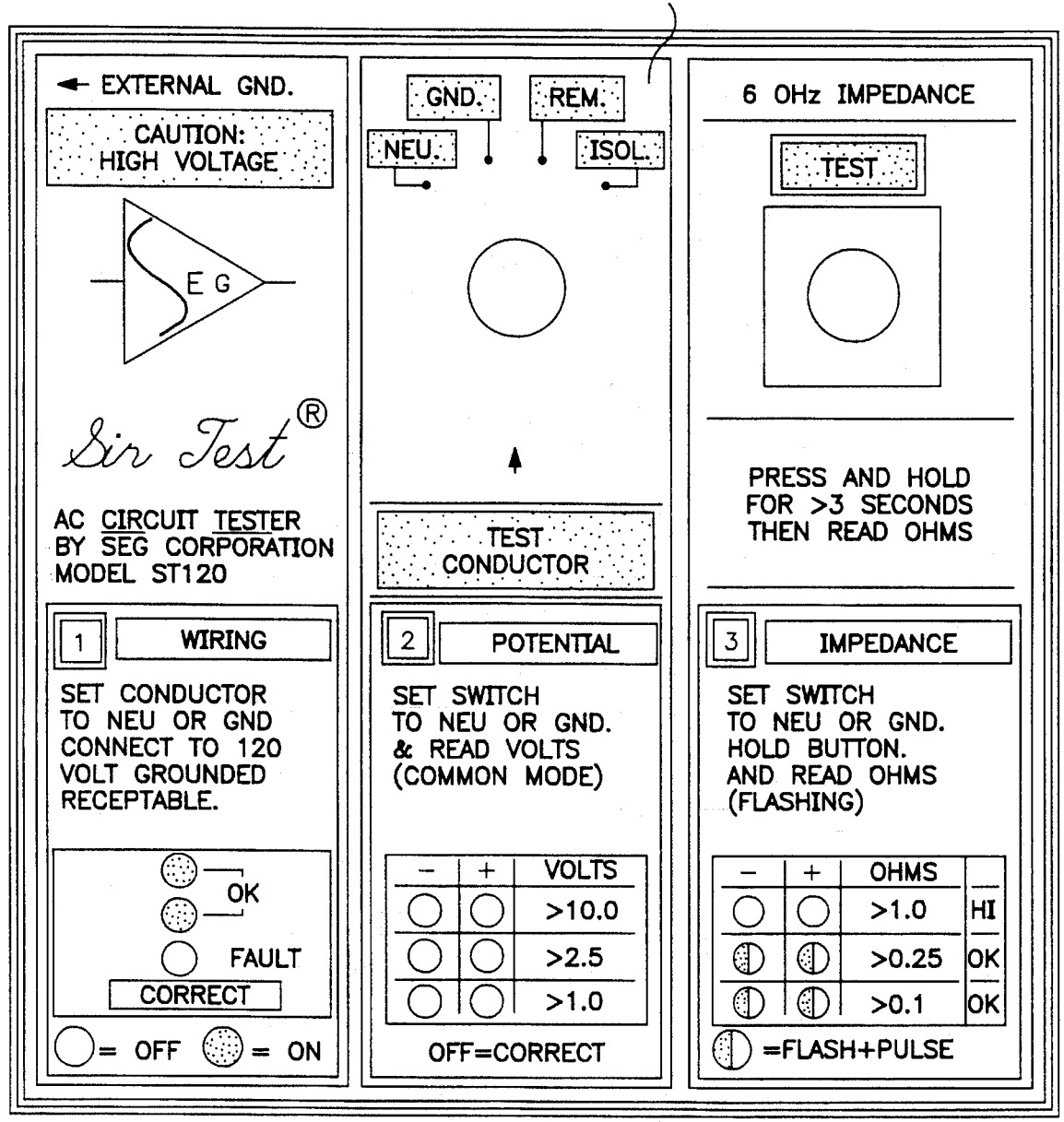
FIG. 11 shows an embodiment of an overlay that can be placed on the front panel of the housing shown in FIG. 9.
Figure 12:
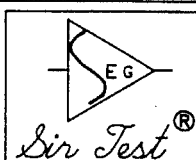
FIG. 12 shows an embodiment of an overlay that can be placed on a rear panel of the housing shown in FIG. 9.

FIG. 10 shows an embodiment of an overlay 62 for displaying information that can be utilized on display panel 58 of housing 48 in connection with circuit 40 of electrical outlet wiring analyzer 10. If utilized with circuit 40, LEDs L1–L3 would be respectively disposed in openings 64–68. LED L4 would be disposed in opening 70. LED L5 would be disposed in opening 72. Finally, LEDs L6–L11 would be respectively disposed in openings 74–84. FIGS. 11 and 12 show embodiments of overlays 86 and 88 that can be placed on respective front 60 and rear (not shown) panels of housing 48 shown in FIG. 9.

Figure 13:
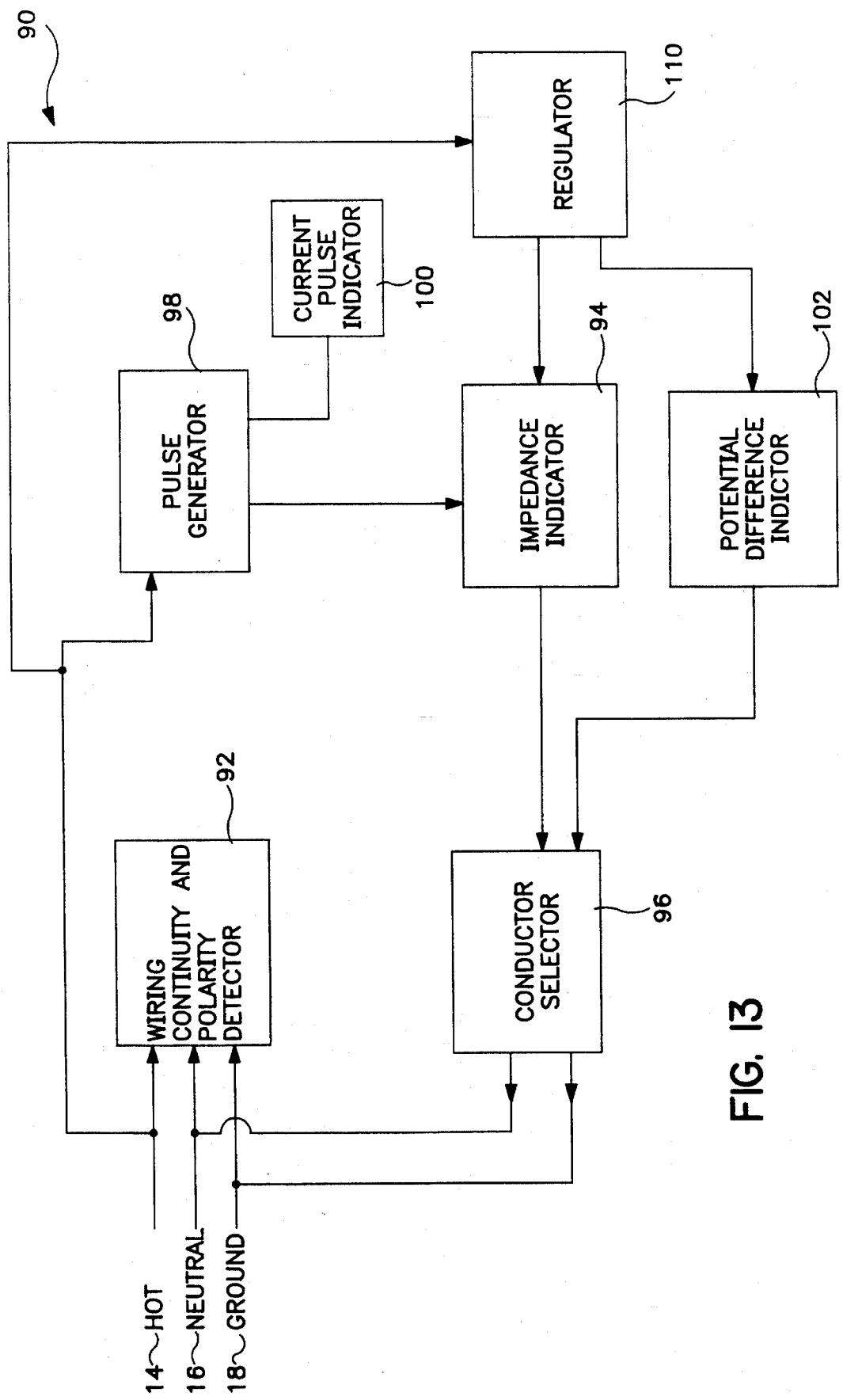
FIG. 13 shows a block diagram of another embodiment of the electrical outlet wiring analyzer of the present invention.

FIG. 13 shows a block diagram of another embodiment of an electrical outlet wiring analyzer 90 of the present invention. Wiring analyzer 90 includes a wiring continuity and polarity detector 92 for verifying the electrical continuity and determining the polarity of the hot 14, neutral 16, and ground 18 conductors of an electrical outlet (not shown). Wiring analyzer 90 also includes an impedance indicator 94 that indicates the impedance of a particular conductor selected by conductor selector 96 at the frequency of a line voltage supplied by the electrical outlet. As can be seen in FIG. 13, conductor selector 96 connects impedance indicator 94 to the neutral 16 and ground 18 conductors. Impedance indicator 94 measures the impedance of a conductor at the frequency of the ac line voltage appearing on hot conductor 14. This is done for the reasons discussed above in connection with the block diagram of FIG. 1 and the circuit of FIG. 2.

Pulse generator 98 provides a periodic, half-cycle of a current pulse at the frequency of the line voltage appearing on hot conductor 14. The current pulse is also intended to contain little or no harmonics of the fundamental frequency of the line voltage. A current pulse indicator 100 indicates when a half-cycle current pulse is provided.

Wiring analyzer 90 further includes a potential difference indicator 102. Potential difference indicator 102 measures the electrical potential difference between neutral 16 and ground 18 conductors when they are selected by conductor selector 96 and pulse generator 98 is not supplying a half-cycle current pulse to impedance indicator 94.

Finally, FIG. 13 shows a regulator 110 that supplies a regulated voltage to impedance indicator 94 and potential difference indicator 102. Regulator 110 receives power from the ac line voltage appearing on hot conductor 14.

Figure 14:
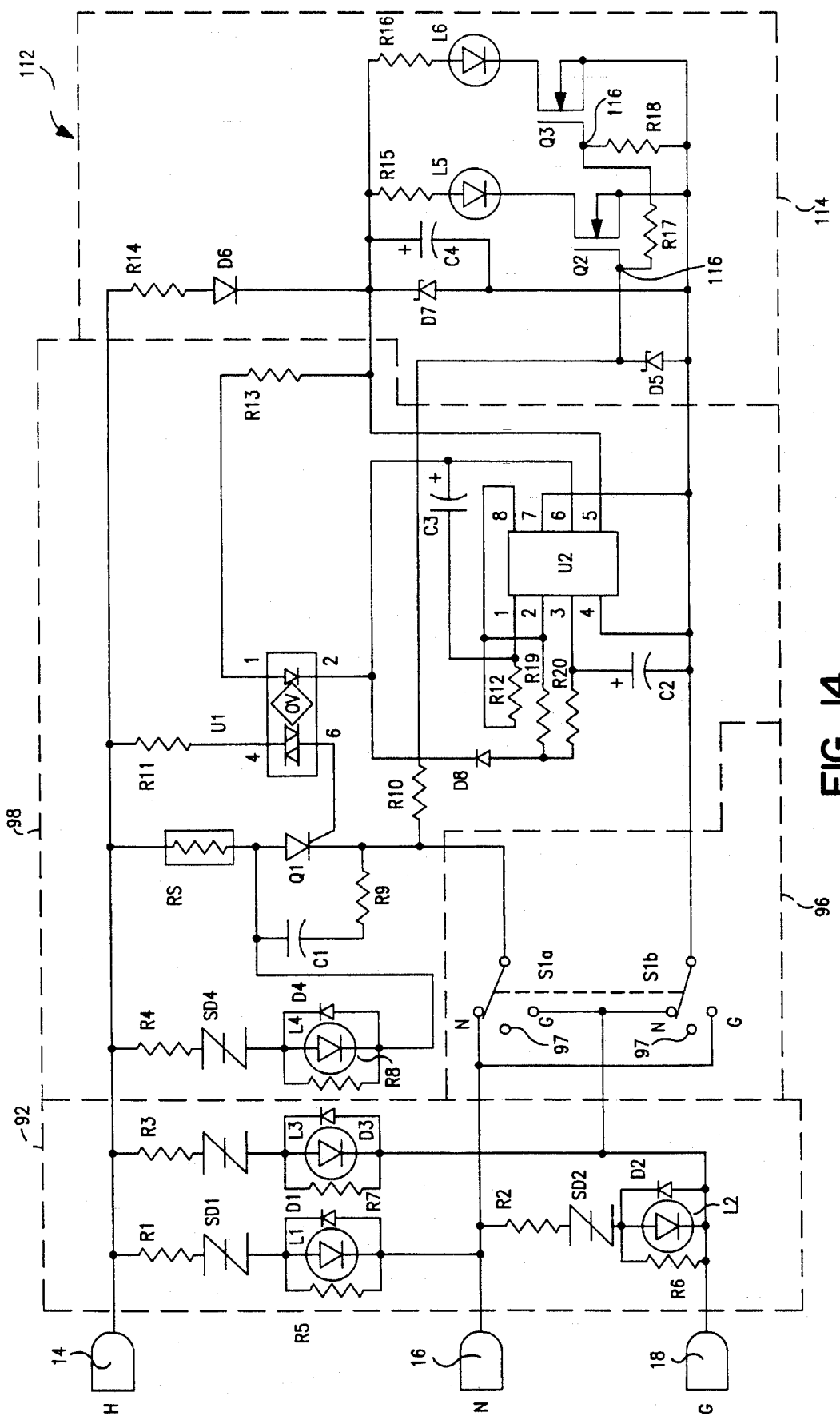
FIG. 14 shows a preferred embodiment of an electrical circuit for the electrical outlet wiring analyzer of FIG. 13.

FIG. 14 shows a preferred embodiment of an electrical circuit 112 for the electrical outlet wiring analyzer 90 of FIG. 13. Wiring continuity and polarity detector 92 is shown as are hot 14, neutral 16, and ground 18 conductors. As discussed in connection with FIG. 13, wiring continuity and polarity detector 92 provides a means for verifying the electrical continuity of conductors 14, 16, and 18 as well as determining their electrical polarity. As shown in FIG. 14, wiring continuity and polarity detector 92 includes three light emitting diode (LED) indicators L1–L3 electrically connected between the conductors such that L1 is connected between hot 14 and neutral 16, L2 is between neutral 16 and ground 18, and L3 is between hot 14 and ground 18. Electrically associated with LEDs L1–L3 are current limiting resistors R1–R3, current diverting resistors R5–R7, rectifier diodes D1–D3 and sidacs SD1–SD3. Resistors R5–R7 are designed to divert current around LEDs L1–L3 in order to reduce the tendency for false indications of continuity due to leakage current flowing to ground from other electrical items on the conductors. Rectifier diodes D1–D3 prevent reverse bias of LEDs L1–L3 and sidacs SD1–SD3 function as voltage-dependant switches to prevent LEDs L1–L3 from operating with line voltages from hot conductor 14 of less than a predetermined amount.

In the configuration shown in FIG. 14, LEDs L1–L3 could indicate any of the following conditions:

1. If L1 and L3 lit and L2 not lit, then correct wiring;
2. If L3 lit and L1 and L2 not lit, then open neutral conductor 16;
3. If L1 lit and L2 and L3 not lit, then open ground conductor 18;
4. If L1 and L2 lit and L3 not lit, then polarity of hot 14 and neutral 16 conductors reversed;
5. If L2 and L3 lit and L1 not lit, then hot 14 and ground 18 conductors are reversed;
6. If L1–L3 not lit, then open hot conductor 14; and
7. If L2 lit and L1 and L3 not lit, then hot conductor 14 on ground conductor 18 or hot conductor 14 on neutral conductor 16 with hot conductor 14 open.

Conductor selector 96 is shown in FIG. 14 as including switches S1a and S1b. Both switches S1a and S1b are shown as being movable into three separate positions. One position, designated by "N" in FIG. 14, electrically connects switch S1a with neutral conductor 16 and switch S1b with ground conductor 18. A second position, designated by "G" in FIG. 14, electrically connects switch S1a with ground conductor 18 and switch S1b with neutral conductor 16. A third position, designated by reference numeral 97 in FIG. 14, places switches S1a and S1b in an electrically open or disconnected position where S1a and S1b are electrically isolated from both neutral and ground conductors 16 and 18. Switches S1a and S1b of conductor selector 96 are spring biased such that they remain in position 97 unless moved by a force acting on them in a direction opposite this bias so that they contact neutral and ground conductors 16 and 18. Thus, neither impedance indicator 94 nor potential difference indicator 102 are enabled unless switches S1a and S1b are moved so as to electrically connect with neutral conductor 16 and ground conductor 18.

Pulse generator 98 is shown in FIG. 14 and generates a current pulse, of known magnitude, in half-wave, one-cycle bursts to a conductor selected by conductor selector 96. The half-cycle pulse occurs at the frequency of the line voltage appearing on hot conductor 14. The pulses are produced by the combination of integrated circuits U1 and U2, switches S1a and S1b of conductor selector 96, silicon controlled rectifier (SCR) Q1, load resistor Rs and the electrical components associated with controlling these devices. The magnitude of the half-cycle current pulse is controlled by selecting an appropriate value of load resistor Rs. LED L4 indicates the provision of such a half-cycle current pulse. Electrically associated with LED L4 are current limiting resistor R4, current diverting resistor R8, rectifier diode D4 and sidac SD4. Resistor R8 is designed to divert current around LED L4 in order to reduce the tendency for false indications of the provision of a current pulse due to leakage current flowing to ground from other electrical items on the conductors. Rectifier diode D4 prevents reverse bias of LED L4 and sidac SD4 functions as a voltage dependent switch to prevent LED L4 from operating with a voltage from line conductor 14 of less than a predetermined amount.

U1 is a zero-voltage crossing opto-coupler. U2 is a precision timer connected for astable operation (an oscillator). U2 derives a direct current operating voltage from the line voltage on hot conductor 14 through resistor R14 and diode D6. This voltage is clamped and regulated by zener diode D7 and capacitor C4. The direct current voltage appears positive at pin 5 and negative at pin 4 of U2. This direct current voltage also supplies light emitting diodes (LEDs) L5 and L6 of impedance indicator 94. A negative supply rail for pin 4 is derived from neutral 16 or ground 18 conductor through switch S1b of conductor selector 96. Thus, if the conductor selected by switch S1b is open or if switch S1b is in position 97, no power is available to U2 and the pulse generator 98 is inoperable.

U2 oscillates with a predetermined period and produces a negative-going output pulse with a predetermined width (duration) at output pin 6. The duration of the output pulse at pin 6 is intended to correspond with the frequency of the line voltage appearing on hot conductor 14. In one embodiment of circuit 112, U2 oscillates with a period of approximately 2 seconds and produces a negative going pulse at output pin 6 with a duration of approximately 16 ms (about 60 Hertz). The output pulse appearing at pin 6 of U2 is applied to enabling pin 2 of U1. During the time that U1 is enabled, U1 suppresses trigger pulses to the gate of SCR Q1, which is connected to pin 6 of U1, until the line voltage on hot conductor 14 is near zero. U1 then triggers Q1 for one cycle of the line voltage and Q1 outputs only the positive half cycle of the line voltage. Q1 does not output the negative half cycle because it is reversed biased.

Switch S1a connects the ac current pulse produced by pulse generator 98 to either neutral conductor 16 or ground conductor 18. Switch S1b connects to either the neutral 16 or ground 18 conductor not connected to by S1a in order to provide a reference point for impedance indicator 94 and potential difference indicator 102 as discussed below.

A threshold detector 114 is shown in FIG. 14. Threshold detector 114 performs the functions of impedance indicator 94 and potential difference indicator 102 described with regard to FIG. 13. Threshold detector 114 has two light emitting diodes (LEDs) L5 and L6 that form a display readout. As can be seen in FIG. 14, the cathodes of L5 and L6 are connected to the drains of N-channel metal oxide silicon field-effect transistors (MOSFETs) Q2 and Q3. A voltage potential difference is applied to a resistive voltage divider string R17 and R18 and clamped to a predetermined maximum voltage by zener diode DS. Points of the voltage divider are connected to gates 116 of N-channel MOSFETS Q2 and Q3. The N-channel MOSFETs are turned on by a positive voltage at gates 116. The ratios of the voltage divider are chosen so that each of the MOSFETs turns on at a predetermined voltage level so as to form two-step impedance and potential difference indicators. When switches S1a and S1b are moved into electrical contact with neutral conductor 16 and ground conductor 18, the potential difference, if any, between conductors 16 and 18 will be indicated by LEDs L5 and L6. When a periodic half-cycle current pulse is produced by pulse generator 98 and applied to a conductor selected by conductor selector 96, the potential difference across the selected conductor causes LEDs L5 and L6 to flash according to the voltage level appearing at gates 116 of MOSFETs Q2 and Q3. The impedance of the selected conductor, assuming no potential difference exists between neutral conductor 16 and ground conductor 18, is equal to the magnitude of this potential difference divided by the known magnitude of the current pulse. As discussed above, the magnitude of the current pulse is controlled by selecting an appropriate value for load resistor Rs. If switches S1a and S1b remain in electrical contact with neutral conductor 16 and ground conductor 18, the potential difference, if any, between conductors 16 and 18 will again be indicated by LEDs L5 and L6 until another periodic, half-cycle current pulse is produced by pulse generator 98. As discussed above, in one embodiment, pulse generator 98 produces a half-cycle current pulse with a duration of approximately 16 ms about every two seconds. Current limiting resistors R15 and R16 control the amount of current flowing through display LEDs L5 and L6.

The voltage across the series combination of R15, L5, and Q2 and the series combination of R16, L6, and Q3 is a square wave whose magnitude is clamped by zener diode D7 and whose frequency is equal to the line voltage frequency appearing on hot conductor 14. The peak of the voltage appearing at the gates 116 of MOSFETs Q2 and Q3 will always occur within the half cycle of this square wave voltage and turn L5 and L6 on unless voltage at gates 116 is 180 degrees out of phase of the square wave voltage. Because the conductor impedance is a ratio of the applied voltage to the current developed through the conductor, the phase angle between the voltage and current on a conductor on which impedance is being measured can range from pure capacitive reactance (in which case voltage would lag behind the current by ninety (90) degrees) to pure inductive reactance (in which case the voltage would lead the current by ninety (90) degrees), without affecting the reading of impedance displayed by LEDs L5 and L6. However, it should be noted that because the current pulse produced by pulse generator 98 is not a full cycle wave, the current pulse is not a true 60 Hertz signal but rather a direct current sample of the alternating current wave appearing on hot conductor 14. Thus, the impedance measurement is less accurate than with a full-wave current pulse provided by circuit 40 of FIG. 2. The impedance measurement of circuit 112 is closer to a direct current resistance measurement. This results due to the fact that conductor reactances are not taken into account because the current pulse does not alternate (reverse direction).

Figure 15:
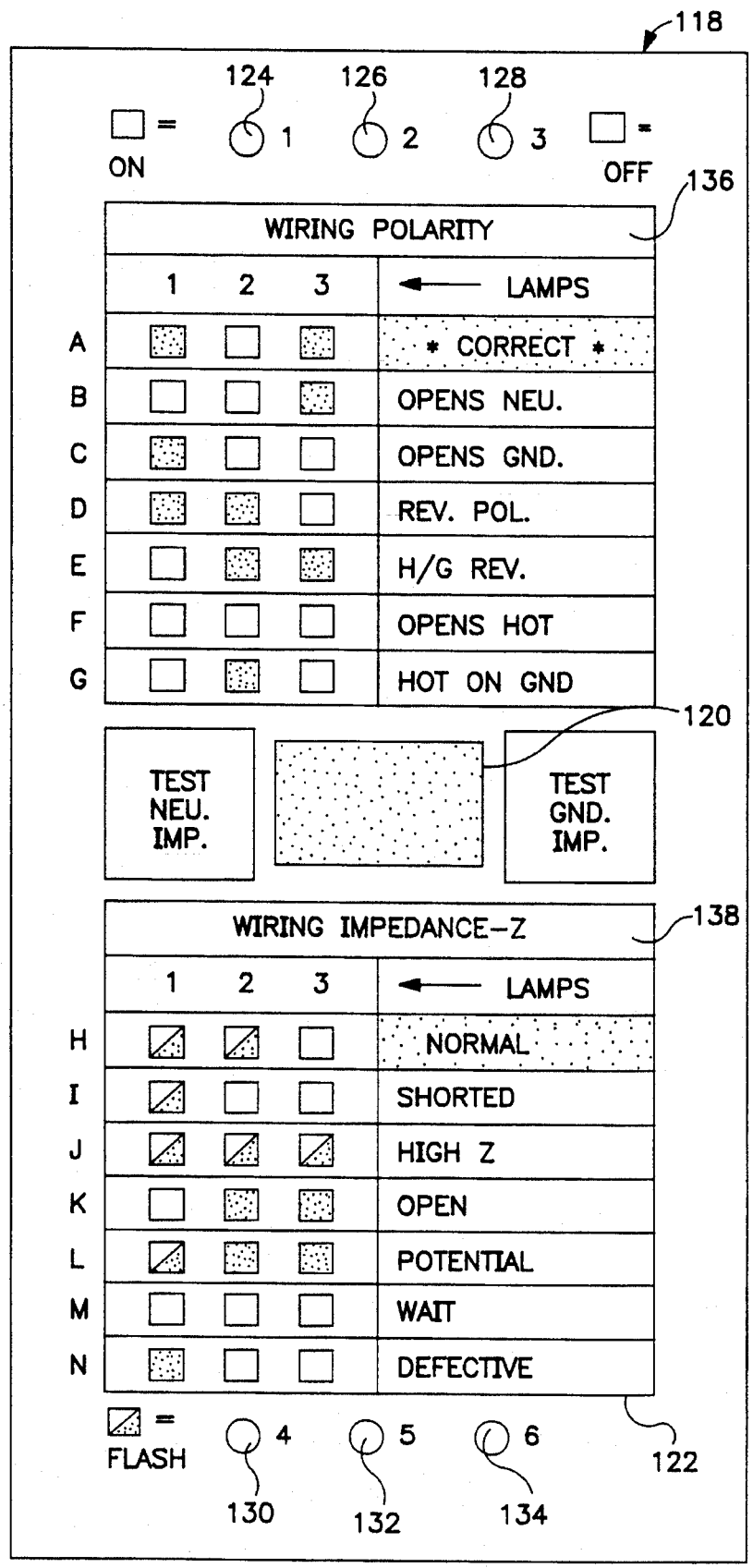
FIG. 15 shows a top view of an embodiment of a housing that can be utilized with the embodiment of the electrical outlet wiring analyzer of FIGS. 13 and 14.

FIG. 15 shows an embodiment of a housing 118 that can be utilized with electrical outlet wiring analyzer 90. Housing 118 has a movable button 120 for creating one or more current pulses via pulse generator 98 as described above. For circuit 112, button 120 would simultaneously control switches S1a and S1b. Housing 118 includes a display panel 122 on which information is displayed. For circuit 112 of FIG. 14, LEDs L1–L3 would respectively be disposed in openings 124, 126, and 128 in display panel 122. LED L4 would be disposed in opening 130. Finally, LEDs L5 and L6 would respectively be disposed in openings 132 and 134.

A wiring polarity overlay 136 for display panel 122 is shown in FIG. 15. Wiring polarity overlay 136 is intended to provide guidance to a user as to the meaning of the possible lighting combinations of LEDs L1–L3. As discussed above in connection with the possible lighting combinations of L1–L3, condition A corresponds to L1 and L3 being lit and L2 being unlit, indicating that hot 14, neutral 16, and ground 18 conductors are correctly wired. Condition B corresponds to L3 being lit and L1 and L2 being unlit indicating that neutral conductor 16 is open. Condition C corresponds to L1 being lit and L2 and L3 being unlit, indicating that ground conductor 18 is open. Condition D corresponds to L1 and L2 being lit and L3 being unlit, indicating that the polarity of hot conductor 14 and neutral conductor 16 are reversed.

Condition E corresponds to L2 and L3 being lit and L1 being unlit, indicating that the polarity of hot conductor 14 and ground conductor 18 are reversed. Condition F corresponds to L1-L3 being unlit, indicating that hot conductor 14 is open. Finally, Condition G corresponds to L2 being lit and L1 and L3 being unlit, indicating that hot conductor 14 is on ground conductor 18 or hot conductor 14 is on neutral conductor 16 and hot conductor 14 is open.

A wiring impedance overlay 138 for display panel 122 is also shown in FIG. 15. Wiring impedance overlay 138 is intended to provide guidance to the user as to the meaning of the possible lighting combinations of LEDs L4–L6. In the embodiment of wiring impedance overlay 138 shown in FIG. 15, the values of resistors R17 and R18 of the resistive voltage divider string of threshold detector 114 are chosen so that LED L5 will light when approximately 2.5 V is present at gate 116 of Q2 and LED L6 will light when a potential greater than approximately 10 V is present at gate 116 of Q3. Load resistor Rs is selected so that the magnitude of the half-wave current pulse is approximately 10 amps. Thus, when only LED L5 flashes, it is indicating that the impedance of the selected conductor is greater than approximately ¼ of an ohm but less than approximately 1 ohm. When LED L6 flashes, it is indicating that the impedance of the selected conductor is greater than approximately 1 ohm.

Condition H corresponds to L4 and L5 flashing and L6 being unlit, indicating that normal impedance is present on the neutral 16 or ground 18 conductor being tested. Condition I corresponds to L4 flashing and L5 and L6 being unlit, indicating that the conductor being tested is shorted. Condition J corresponds to L4–L6 flashing, indicating that there is a high impedance on the conductor being tested. Condition K corresponds to L5 and L6 being continuously lit and L4 being unlit, indicating that the conductor being tested is open circuited. Condition L corresponds to L4 flashing and L5 and L6 being continuously lit indicating that there is an unacceptably large voltage potential on the conductor being tested. Condition M corresponds to L4–L6 being unlit, indicating that a thermal overload has temporarily disabled circuit 112 because of excess heat in load resistor Rs. Finally, condition N corresponds to L4 being continuously lit and L5 and L6 being unlit, indicating that the circuit 112 is defective.

Figure 16:
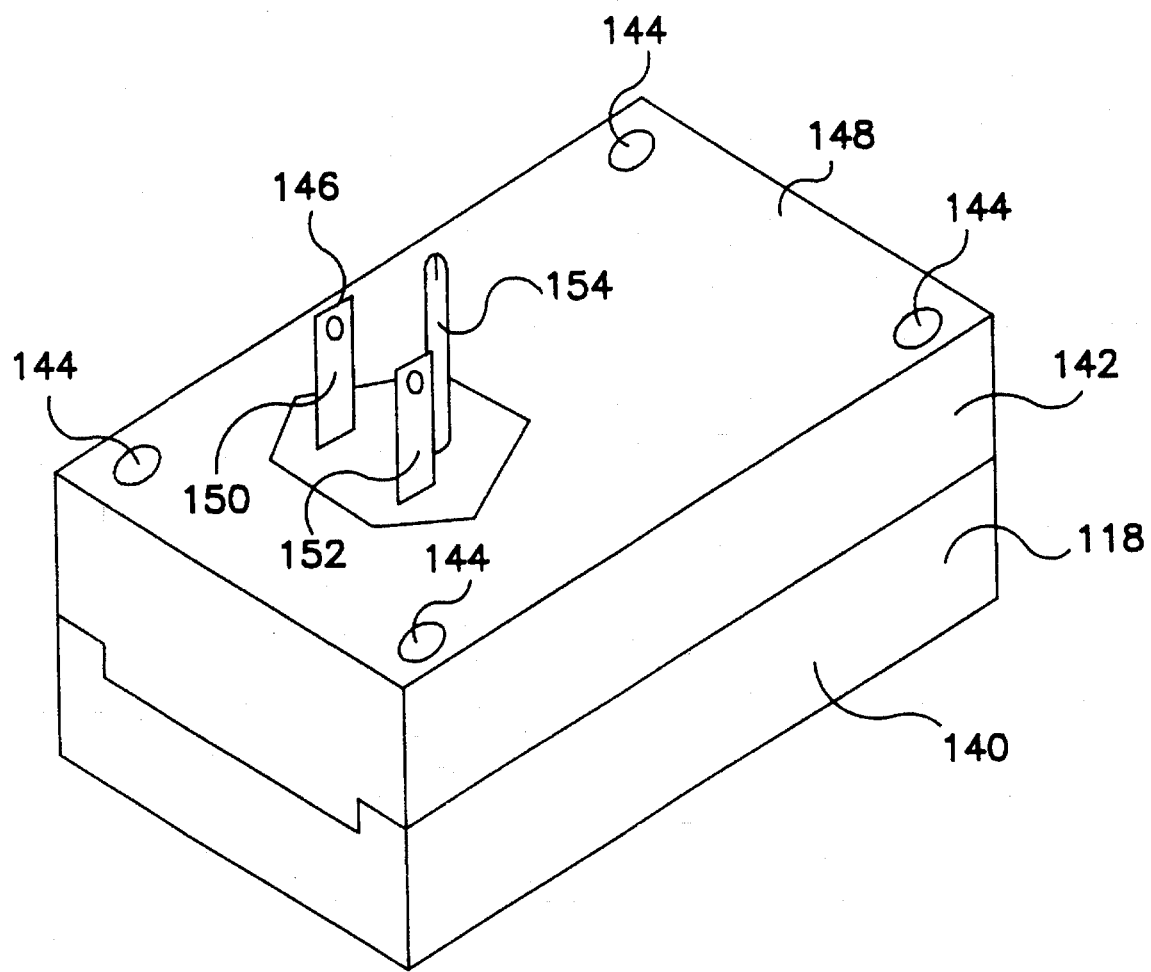
FIG. 16 shows a bottom perspective view of the housing of FIG. 15.

FIG. 16 shows a bottom perspective view of housing 118 shown in FIG. 15. As can be seen in FIG. 15, housing 118 has a substantially rectangular shape and includes a first half 140 and a second half 142. First and second halves 140 and 142 are joined together by a plurality of fasteners (not shown) that are disposed in openings 144. Display panel 122 is formed on a top surface (not shown) of first half 140. A plurality of electrical plugs 146 outwardly extend away from bottom surface 148 of second half 142. Electrical plugs 146 allow circuit 112 to be electrically connected with a standard outlet so that the hot, neutral, and ground 14, 16, and 18 conductors of the outlet can be tested. Electrical plugs 146 include first and second blade contacts 150 and 152 for electrical connection of circuit 12 with hot and neutral conductors 14 and 16 of the outlet. Electrical plugs 146 further include a prong contact 154 for electrical connection of circuit 112 with ground conductor 18 of the outlet.

From the preceding description of the preferred embodiments, it is evident that the objects of the invention are attained. Although the invention has been described and illustrated in detail, it is to be clearly understood that the same is intended by way of illustration and example only and is not to be taken by way of limitation. The spirit and scope of the invention are to be limited only by the terms of the appended claims.

What is claimed is:

1. An electrical outlet wiring analyzer for analyzing an electrical outlet that includes a plurality of conductors, comprising:

generator means for providing a full cycle alternating current pulse having a frequency substantially equal to a frequency of an alternating current voltage supplied by the electrical outlet;

connecting means for electrically applying the alternating current pulse to at least one of the conductors; and means for determining an impedance of the conductor to which the alternating current pulse is applied based upon a magnitude of a voltage appearing on the conductor that results from the alternating current pulse and a magnitude of the alternating current pulse applied to the conductor.

2. The electrical outlet wiring analyzer of claim 1, wherein there are three conductors: a hot conductor, a neutral conductor, and a ground conductor, and further wherein the connecting means selectively applies the alternating current pulse to one of the neutral and ground conductors.

3. The electrical outlet wiring analyzer of claim 2, further comprising jack means coupled to the connecting means for electrically attaching to a remote ground conductor and wherein the connecting means selectively applies the alternating current pulse to one of the neutral, ground, and remote ground conductors.

4. The electrical outlet wiring analyzer of claim 1, wherein the generator means includes a zero-voltage switch crossing circuit, a timer, the zero-voltage switch crossing circuit being electrically connected to the timer, a push button switch electrically connected between the zero-voltage switch crossing circuit and the timer, and a current controlled switch electrically connected to the alternating current voltage supplied by the electrical outlet, the connecting means, and an output of the zero-voltage switch crossing circuit, the output of the zero-voltage switch crossing circuit enabling the current controlled switch for one cycle of the alternating current voltage.

5. The electrical outlet wiring analyzer of claim 14, further including means for limiting the magnitude of the alternating current pulse electrically connected between the current controlled switch and the connecting means.

6. The electrical outlet wiring analyzer of claim 5, wherein the alternating current pulse magnitude limiting means includes a resistor and the current controlled switch includes a triac having a gate electrically connected to the output of the zero-voltage switch crossing circuit, a main terminal 1 electrically connected to the resistor, and a main terminal 2 electrically connected to the alternating current voltage.

7. The electrical outlet wiring analyzer of claim 5, further comprising means for preventing thermal overload of the alternating current pulse magnitude limiting means.

8. The electrical outlet wiring analyzer of claim 5, further comprising means for indicating application of the alternating current pulse electrically connected in parallel with the alternating current pulse magnitude limiting means.

9. The electrical outlet wiring analyzer of claim 8, wherein the alternating current pulse application indicating means includes a light emitting diode, means for preventing reverse bias of the light emitting diode, means for diverting current from the light emitting diode to prevent false indications of the application of the alternating current pulse due to leakage of current from items electrically connected to the conductors, the light emitting diode being electrically connected in parallel with the reverse bias preventing means and the diverting current means, and voltage controlled switch means, electrically connected in series with the combination of the light emitting diode, reverse bias preventing means, and diverting current means, for preventing operation of the light emitting diode with an electrical potential difference less than an electrical trigger potential difference of the voltage controlled switch means.

10. The electrical outlet wiring analyzer of claim 9, wherein the voltage controlled switch means includes a sidac, the reverse bias preventing means includes a diode, and the current diverting means includes a resistor, the diode having an anode electrically connected to a cathode of the light emitting diode and a cathode electrically connected to an anode of the light emitting diode.

11. The electrical outlet wiring analyzer of claim 1, wherein the connecting means includes a switch.

12. The electrical outlet wiring analyzer of claim 1, wherein the impedance determining means includes means for indicating an impedance value, voltage controlled switch means for controlling enabling of the impedance value indicating means, means for supplying a regulated voltage to the impedance value indicating means and the voltage controlled switch means, and voltage divider means for providing at least two different voltages to the voltage controlled switch means, the voltage controlled switch means being electrically connected to the impedance value indicating means and the voltage divider means, the voltage divider means being electrically connected to the conductor to which the alternating current pulse is applied.

13. The electrical outlet wiring analyzer of claim 12, wherein the voltage controlled switch means includes metal oxide silicon field-effect transistors each having a drain, a source, and a gate, the sources being electrically connected to the regulated voltage supplying means, the gates being electrically connected to the voltage divider means, and further wherein the impedance value indicating means includes light emitting diodes the anodes of which are electrically connected to the regulated voltage supplying means and the cathodes of which are electrically connected to the drains of the metal oxide silicon field-effect transistors.

14. The electrical outlet wiring analyzer of claim 13, wherein the voltage divider means includes two separate sets of resistors, a first set connected to gates of N-channel metal oxide silicon field-effect transistors and a second set connected to gates of P-channel metal oxide silicon field-effect transistors, and further including first means for applying only a positive half-cycle of the alternating current pulse to the gates of the N-channel metal oxide silicon field-effect transistors and second means for applying only a negative half-cycle of the alternating current pulse to the gates of the P-channel metal oxide silicon field-effect transistors.

15. The electrical outlet wiring analyzer of claim 14, where the first and second means include diodes.

16. The electrical outlet wiring analyzer of claim 13, wherein the regulated voltage supplying means includes a first regulator means for supplying regulated power to N-channel metal oxide silicon field-effect transistors during a positive half-cycle of the alternating current voltage supplied by the electrical outlet and a second regulator means for supplying regulated power to P-channel metal oxide silicon field-effect transistors during a negative half cycle of the alternating current voltage supplied by the electrical outlet.

17. The electrical outlet wiring analyzer of claim 16, wherein each of the first and second regulator means includes a resistor, a diode, and a zener diode.

18. The electrical outlet wiring analyzer of claim 12, wherein the impedance value indication providing means indicates the impedance value during both a positive and negative half-cycle of the alternating current pulse.

19. The electrical outlet wiring analyzer of claim 12, wherein the impedance value indicating means indicates the electrical potential difference between the conductor to which the alternating current pulse is applied and a reference conductor prior to and subsequent to the application of the pulse, the conductor to which the alternating current pulse is applied and the reference conductor both being selected by the connecting means.

20. The electrical outlet wiring analyzer of claim 19, wherein both a positive and a negative electrical potential difference between the conductors is indicated.

21. The electrical outlet wiring analyzer of claim 1, further comprising means for verifying electrical continuity of the conductor to which the alternating current pulse is applied.

22. The electrical outlet wiring analyzer of claim 21, wherein the electrical continuity verifying means includes a diode and a light emitting diode, the diode having an anode electrically connected to an output of the generator means and a cathode electrically connected to an anode of the light emitting diode, the cathode of the light emitting diode being electrically connected through the connecting means to the conductor to which the alternating current pulse is applied.

23. The electrical outlet wiring analyzer of claim 1, further comprising means for verifying electrical continuity of the conductors of the electrical outlet, means for determining a polarity of the conductors of the electrical outlet, and voltage controlled switch means, electrically connected in series with the electrical continuity verifying means and polarity determining means, for preventing the electrical continuity verifying means and polarity determining means from operating with an electrical potential difference less than an electrical trigger potential difference of the voltage controlled switch means.

24. The electrical outlet wiring analyzer of claim 23, wherein the voltage controlled switch means includes a sidac.

25. The electrical outlet wiring analyzer of claim 23, wherein the electrical continuity verifying means and polarity determining means includes a light emitting diode, means for preventing reverse bias of the light emitting diode, and means for diverting current from the light emitting diode to prevent false indications of electrical continuity and polarity of the conductors due to leakage of current from items electrically connected to one or more of the conductors, the light emitting diode being electrically connected in parallel with the reverse bias preventing means and the diverting current means.

26. The electrical outlet wiring analyzer of claim 28, wherein the diverting current means includes a resistor and the preventing reverse bias means includes a diode having an anode electrically connected to a cathode of the light emitting diode and a cathode electrically connected to an anode of the light emitting diode.

27. The electrical outlet wiring analyzer of claim 23, wherein there are three conductors: a hot conductor, a neutral conductor, and a ground conductor, and further wherein there are electrical continuity verifying means, polarity determining means, and voltage controlled switch means electrically connected between each of the hot conductor and neutral conductor, the hot conductor and ground conductor, and the neutral conductor and ground conductor.

* * * * *